MULTIEMITTER-FOLLOWER CIRCUITS

Filed Jan. 4, 1966 2 Sheets-Sheet 1

WILLIAM F. JORDAN JR
INVENTOR

BY [signature]

ATTORNEYS

Nov. 11, 1969 W. F. JORDAN, JR 3,478,319

MULTIEMITTER-FOLLOWER CIRCUITS

Filed Jan. 4, 1966 2 Sheets-Sheet 2

WILLIAM F. JORDAN JR
INVENTOR

BY Alfred H. Rosen
Thomas N. Tarrant

ATTORNEYS 3,478,319

MULTIEMITTER-FOLLOWER CIRCUITS

William F. Jordan, Jr., Wellesley, Mass., assignor, by mesne assignments, to Honeywell Inc., a corporation of Delaware Filed Jan. 4, 1966, Ser. No. 518,585
Int. Cl. H03k *19/08, 23/08, 23/22*
U.S. Cl. 340—166 12 Claims

ABSTRACT OF THE DISCLOSURE

A digital computer transistor circuit is disclosed that includes logical input circuitry capable of accepting a plurality of input signals and has at least one multiemitter transistor whose base electrode is connected to the logical input circuitry and whose plurality of emitter electrodes are each connected to a separate output circuit. Another embodiment discloses a plurality of such multiemitter transistors connected in a matrix configuration.

This invention relates to digital computer circuits and in particular to the use of a multiemitter semiconductor element connected in emitter-follower circuit arrangements for blocking or unblocking a plurality of paths simultaneously.

For reasons of economy it has been a customary practice in industry to use commercially mass produced components wherever possible. In the digital field today there is an increasing use of integrated circuits in which a plurality of semiconductor active and passive elements in a circuit configuration use one base layer of semiconductor material. Extremely compact modules of such integrated circuits are commonly known as monolithic chips. In the manufacture of such integrated circuits there is no real limitation to the use of anything resembling the conventional mass produced discrete elements. Schematic diagrams drawn descriptive of the integrated circuits use circuit symbols representative of conventional discrete elements in the nature of transistors, diodes, resistors, and the like, however there is no separate existence of these discrete elements in a monolithic chip.

Sylvania in its literature on "Universal High-Level Logic" (SUHL) shows multiemitter semiconductor active elements using electrode configurations not available as commercial discrete elements. Sylvania has used this type of configuration to allow for a plurality of inputs to a single active element having only one base electrode and one collector electrode. Sylvania's circuit provides for a plurality of at least partially isolated inputs, any one of which can provide an output.

Now in accordance with the present invention it has been found that a multiemitter-follower configuration can be used to great advantage to provide a plurality of isolated low impedance outputs from a single input.

The output multiemitter-followers in accordance with the invention can provide drive inputs to each of a plurality of logical GATES while maintaining a degree of isolation between each Gate. A GATE will be recognized as a logical device whose output is energized as a function of a plurality of inputs. Conventionally the necessary isolation has required isolating resistors or a plurality of diodes connected to a single transistor electrode. Such arrangements increase circuit elements and decrease output power. The multiemitter-follower of the invention operates especially well in matrices of switching devices. Thus it is an object of the present invention to define a multiemitter-follower circuit.

It is a further object of the invention to define circuits using plural emitter semiconductors for applying the same output signal to a plurality of loads simultaneously.

It is still a further object to define switching matrices using plural emitter-follower semiconductor driver elements.

Further objects and features of the present invention will become apparent upon reading the following specification together with the drawings in which.

Figure 1:
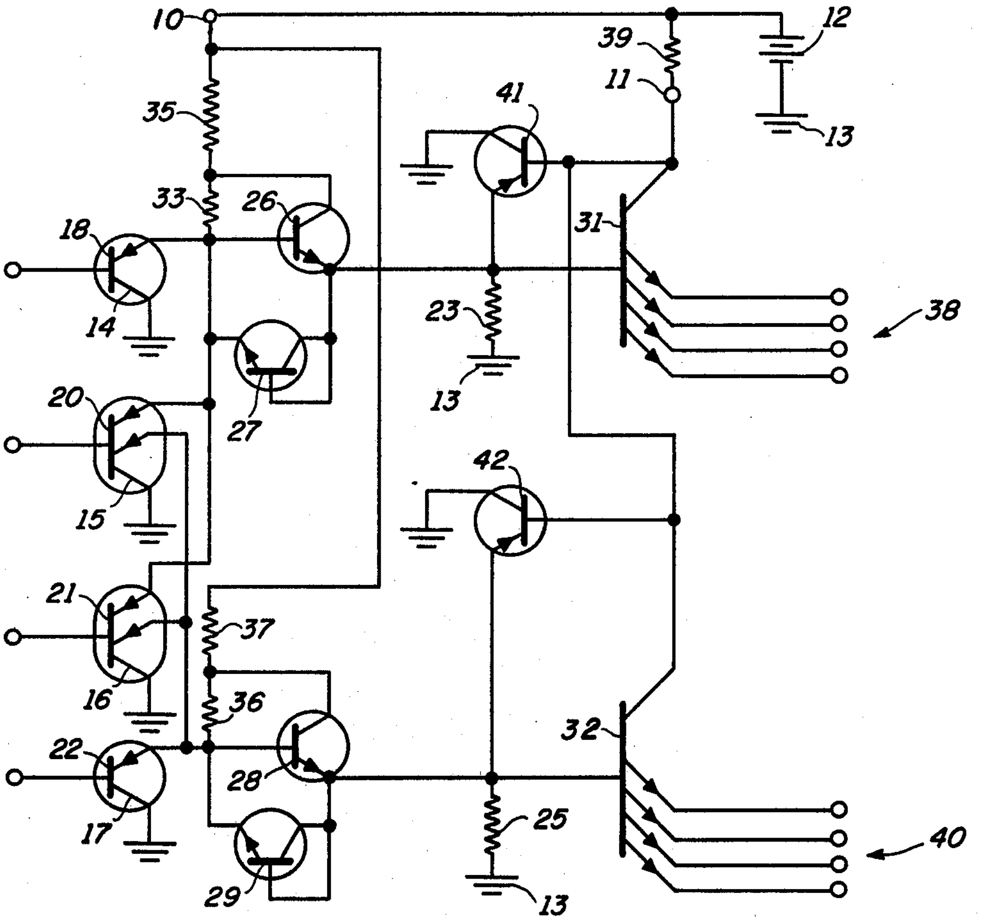
FIG. 1 is a schematic of a gating module in accordance with the invention.
Figure 2:
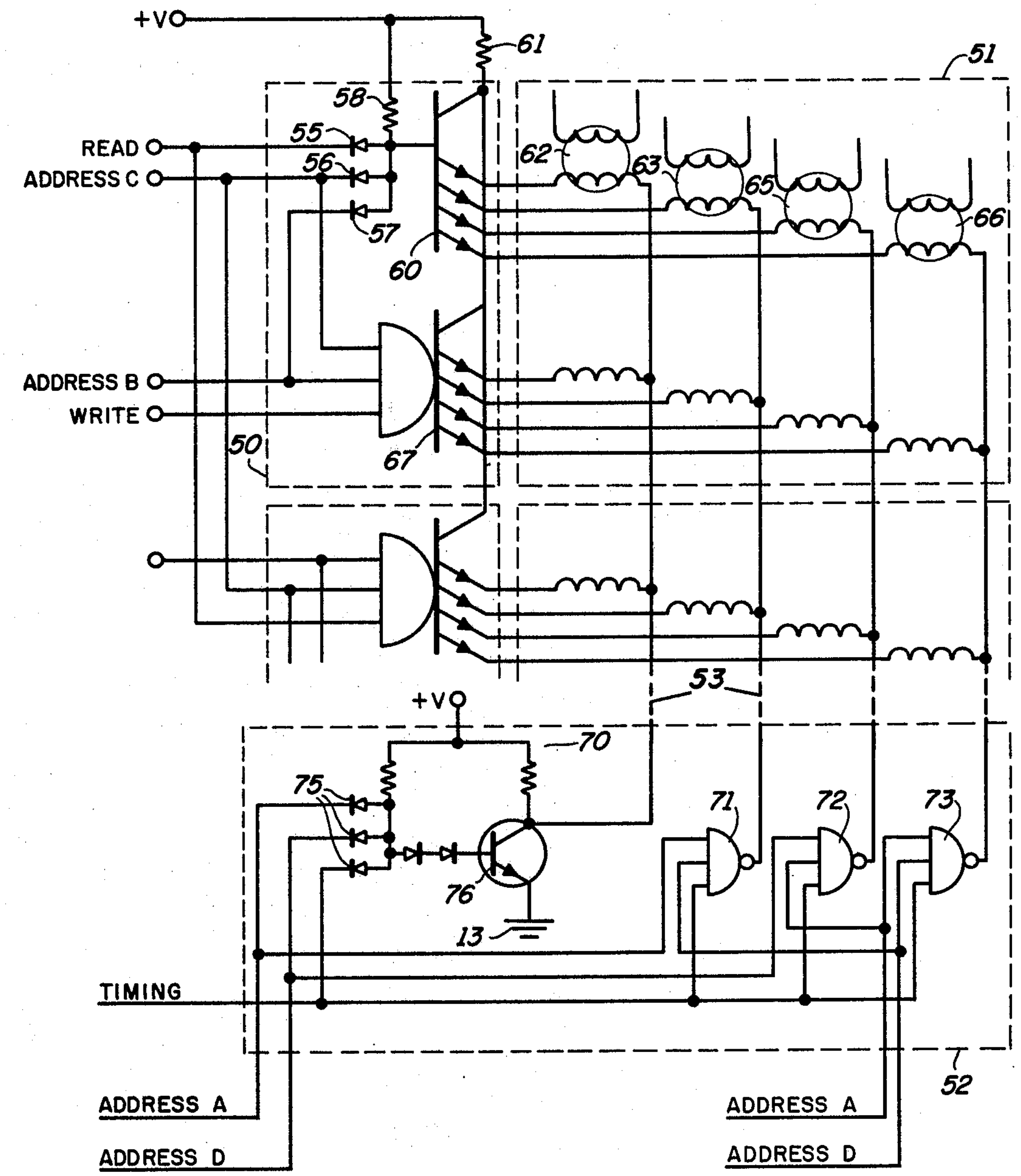
FIG. 2 is a schematic of a switch matrix using a second embodiment of gating modules in accordance with the invention.

FIG. 1 illustrates a gating module that is functionally similar to the modules indicated inside the dashed lines in FIG. 2 but providing more gain and higher speed. The module depicted in FIG. 1 is particularly suited for monolithic chip integrated circuits. Thus FIG. 1 illustrates a circuit having fourteen connections suitable for the fourteen leads conventional in monolithic chips.

Terminal 10 is for the connection to a voltage source which is depicted in FIG. 1 as battery 12. Terminal 11 is for a current source which is depicted as resistor 39 returned to the voltage source. The other side of battery 12 is depicted by reference symbol 13 as connected to a common reference point with the collector electrodes of transistors 18, 20, 21, and 22, 41 and 42 and also to resistors 23 and 25. This reference connection, in the case of a monolithic chip, can be to a conductive support or case for the monolithic chip. The reference connection is usually made to one of the standard fourteen leads, however the embodiment shown requires fifteen connections and the conductive support was utilized for the reference.

Transistors 18, 20, 21, and 22, along with transistors 26, 27, 28, and 29, form an input gating circuit for multiemitter semiconductor elements 31 and 32, having an output terminal connected to each of their emitters. The input terminals are connected to the base electrodes of transistors 18, 20, 21, and 22 and each of these transistors is made conductive by a negative going input pulse.

An emitter electrode of each of transistors 18, 20, and 21 is connected to one terminal of a voltage divider network made up of resistors 33 and 35. The other terminal of the voltage divider is connected to supply voltage terminal 10. An emitter electrode of transistor 22 and a second emitter electrode each of transistors 20 and 21 are each connected in common to a terminal of a second voltage divider network made up of series resistors 36 and 37 with the second terminal of the network connected to voltage supply terminal 10.

Transistor 26 has its base electrode connected to the first terminal of the voltage divider network made up of resistors 33 and 35 and its collector electrode connected to the series connection point of resistors 33 and 35. The emitter of transistor 26 is connected to the base of multiemitter semiconductor 31.

Transistor 27 is connected as a speedup diode between the emitter and base electrode of transistor 26. A resistor 23 is connected between the emitter of transistor 26 and reference point 13. Multiemitter semiconductor 31 has its collector electrode connected to supply terminal 11 and four emitter electrodes with separate connection terminals 38 for connection to external load circuits.

Transistors 28 and 29 are essentially identical to transistors 26 and 27 connected to each other and to resistors 36 and 37 in the same manner that transistors 26 and 27 are connected to each other and to resistors 33 and 35. The emitter electrode of transistor 28 is connected to the base electrode of multi-emitter semiconductor 32. A resistor 25 is connected between the base electrode of semiconductor 32 to reference point 13. The collector electrode of semiconductor 32 is connected to supply terminal 11 and four emitter electrodes of semiconductor 32 are connected to output terminals 40 for connection to separate external loads.

Transistors 41 and 42 are formed as an unavoidable consequence of the single epitaxial construction frequently used for monolithic chips. They function parasitically and usually some extra doping is required to prevent any significant gain in such parasitic operation. In the present circuit it came as a pleasant surprise that transistors 41 and 42 improved the speed and stability of operation and could be utilized beneficially. The emitters and bases of transistors 41 and 42 are in fact the bases and collectors of semiconductor elements 31 and 32 respectively. The collectors of transistors 41 and 42 are connected to reference point 13.

In operation, with a negative input at the base electrode of transistor 18 current passes from reference point 13 through the collector emitter circuit of transistor 18 and voltage divider resistors 33 and 35 so as to provide a voltage drop at the base electrode of transistor 26. A voltage drop at the base electrode of transistor 26 turns transistor 26 off so that the base electrode of semiconductor 31 is biased by the voltage at reference point 13 through resistor 23. Under these conditions semiconductor 31 is blocked and current cannot flow through a load connected to any one of terminals 38. It will be seen that a negative voltage applied to the base electrodes of either of transistors 20 or 21 will produce the same effect causing current to flow through resistors 33 and 35 and resulting in a blocking of semiconductor 31. Only with a positive input voltage, turning transistors 18, 20, and 21 off, will transistor 26 and semiconductor 31 become conductive. The operation of transistors 28 and 29 and semiconductor 32 is the same as the operation of transistors 26 and 27 and semiconductor 31.

A negative input at the base electrode of transistor 20 will result in blocking of both semiconductors 31 and 32. Likewise a negative input at the base electrode of transistor 21 will result in blocking of both semiconductors 31 and 32. A negative input at the base electrode of transistor 18 results in the blocking of semiconductor 31 alone and a negative input at the base electrode of transistor 22 results in a blocking of semiconductor 32 alone.

When transistor 26 has been conducting and one of transistors 18, 20 or 21 goes into conduction, the base electrode of transistor 26 goes negative with respect to its emitter. Transistor 27 operating as a diode provides a low impedance discharge path for excess carriers between the base and emitter of transistor 26. This greatly improves the turn-off time of the circuit. Transistor 29 in the base-emitter circuit of transistor 28 operates in the same way to enhance the turn-off speed of transistor 28.

Transistors 41 and 42 each perform dual functions. Semiconductor element 31 operates as a saturated switch requiring saturation current in its base-emitter circuit. When element 31 is turned on by a positive going signal, this signal also applies a voltage to the emitter of transistor 41. This becomes a forward bias on transistor 41 as soon as saturation of semiconductor 31 causes the collector potential of semiconductor 31 to fall below its base electrode potential. Thus transistor 41 acts as a regulator on the saturation level of element 31. A discrete element current determining resistor 39 acts as a load to establish the operation voltage for transistor 41. Since transistor 41 goes into conduction as soon as element 31 becomes saturated, it diverts excessive drive current from element 31. This diversion of excessive drive current reduces storage of excess carriers in element 31 thus improving turnoff speed. Transistor 42 operates in the same way with respect to semiconductor element 32. Thus transistors 41 and 42 operate to make the emitter current of semiconductor elements 31 and 32 respectively independent of drive current and also limit build up of excess carriers so as to increase turnoff speed.

Referring now to FIG. 2 there is illustrated a first gating module 50, a group 51 of driver transformers connected to the output terminals of gating module 50, and an enabling circuit 52 with output terminals also connected to driver transformers in group 51. Dashed lines 53 represent other groups of driver transformers connected to other gating modules also connected to the lines from enabling circuit 52 in common with the connections to the respective driver transformers in group 51. This circuit is representative of a decoding selector-driver circuit suitable for use in driving rapid access memory elements. The gating module 50 functions the same as the gating module illustrated in FIG. 1 but without the advantages pertaining to gain stabilized output and high speed turnoff enhancement described in relation to FIG. 1.

Instead of the transistor inputs used in FIG. 1 a simple diode AND GATE is used. Thus diodes 55, 56, and 57 with their anodes connected through resistor 58 to a power supply terminal provide a gating action to determine a voltage applied to the base electrode of semiconductor element 60. The common anode of diodes 55, 56, and 57 is directly connected to the base of semiconductor element 60. The collector electrode of semiconductor element 60 is connected through a resistor 61 to a voltage supply terminal and four emitter electrodes of element 60 are each connected to one of four driver transformers 62, 63, 65, and 66.

As in FIG. 1 a second multiemitter semiconductor element 67 with an input gate is depicted in gating module 50. Since the details are the same as that shown for the input gating of element 60 the input circuit for element 67 is illustrated as a logical AND function with the multiemitter device connected to it. Four more driver transformers are connected each one to an emitter electrode of element 67. Enabling circuit 52 provides the other side for a current path through the transformer windings. In a matrix each multiemitter semiconductor element has one emitter connected to one transformer for common connection with other multiemitter functions to an output from circuit 52. Thus with four emitters on each element there are four transformers and four enabling portions of enabling circuit 52.

Enabling circuit 52 contains no particular circuit arrangements critical to the invention. It is depicted as comprising four logic NAND GATES (i.e. inverted AND) 70, 71, 72, and 73. GATE 70 is illustrated in detail. Three diodes 75 must all be blocked by positive signal so that transistor 76 can conduct, passing current from reference point 13 through the primary winding of transformer 62 if element 60 is unblocked simultaneously. This then provides an output pulse on the secondary winding of driver transformer 62. Gating module 50 and enabling circuit 52 operate as decoding selector circuits selecting any particular one or more transformers to provide an output signal. Selection is determined by input address, read/write and timing signals.

The need of maintaining reasonable isolation between at least one end of each of the transformer primaries is readily apparent. If the primaries of transformers 62, 63, 65 and 66 were all connected to a single emitter of element 60 and both element 67 and transistor 76 become conductive while element 60 was blocked, then current could pass backwards through transformers 63, 65, and 66 to their counterparts connected to element 67. This would give a possible pulse out from any or all transformers and would be an excessive load on the circuit. The separate emitters used in the inventive circuit supply the required isolation.

While the emitter follower configuration provides very good power output for monolithic circuit use, at the present stage of the art it has been found desirable to increase the power capabilities of each output line in order to drive large memory stacks. Thus the driver transformers such as transformer 62 have been used to drive discrete element transistors. Discrete element as used herein defines a circuit element which exists independently of other elements and is connected into a circuit individually. It is used in opposition to integrated element which defines an element showing a common semiconductor body for a plurality of operative semiconductor devices. The discrete element transistor increases the power output so that a two-diode-per-line core selection matrix can be operated with a safe power margin for control of storage and read/write action in a magnetic core memory stack.

Figure 3:
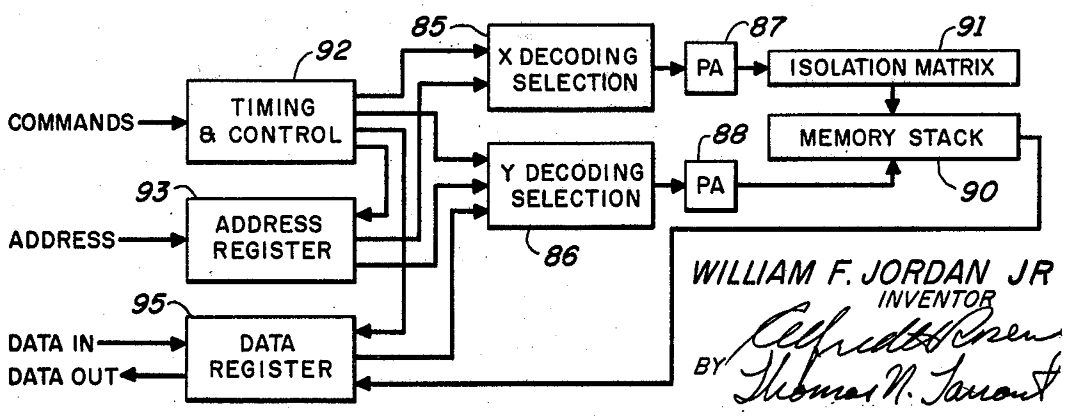
FIG. 3 is a block diagram of a fast access memory in which gating modules in accordance with the invention provide decoding, selection, and driving capability.

FIG. 3 is a block diagram illustrating the organization of a rapid access memory system utilizing the present invention.

In the block diagram of FIG. 3 the X Decoding Selection and Driver matrix 85 is a matrix of the type illustrated in FIG. 2. The Y Decoding Selection and Driver matrix 86 is another matrix of the type illustrated in FIG. 2. Each of these can be identical to FIG. 2 or preferably they are the FIG. 2 circuit using gating modules of the FIG. 1 configuration. As can be seen by reference to FIG. 2, the output drivers of both matrix 85 and matrix 86 are driver transformer secondaries. The transformer secondaries drive power amplifiers 87 and 88 respectively to provide adequate power for operation of memory stack 90. At present the power normally required to drive a memory stack is higher than that readily obtainable from monolithic circuits. Thus separate power amplifiers such as discrete transistors are introduced after both matrix 85 and 86. In addition, a read/write isolation matrix 91 is employed. This is suitably a two diode per line selection matrix that permits current flow through memory elements in either of opposite directions without undesired interaction. Memory stack 90 is suitably a matrix of magnetic core memory elements. Operational inputs are applied through a Timing and Control circuit 92, an Address Register 93, and a Data Register 95. Output data is supplied from the memory 90 directly to Data Register 95.

While the invention has been described in relation to specific embodiments, various modifications thereof will be apparent to those skilled in the art and it is intended to cover the invention broadly within the spirit and scope of the appended claims.

I claim:

1. Electronic apparatus comprising (a) a semiconductor active element having a base electrode, a collector electrode, and a plurality of emitter electrodes;

(b) means to apply an input signal to said base electrode;

(c) means to apply one side of an electrical source to said collector electrode;

(d) a plurality of output means, each output means having a first terminal and a second terminal and having the first terminal thereof connected to a different one of said emitter electrodes; and (e) enabling means arranged to respond to an enabling signal to selectively connect the second terminal of each output means to the other side of the electrical source.

2. Electronic apparatus as defined in claim 1 in which each output means has a bilateral circuit element connected between said first and second terminals thereof.

3. An electronic apparatus according to claim 1 in which said plurality of output means each comprises a transformer.

4. An electronic apparatus according to claim 1 in which said means to apply an input signal is a diode gate.

5. An electronic apparatus according to claim 1 comprising at least two semiconductor active elements according to claim 1 and in which said means to apply an input signal comprises at least further semiconductor active elements each having a plurality of emitter electrodes and means connecting at least one of the emitter electrodes of each of said further semiconductor active elements to the base electrode of each of the semiconductor active elements according to claim 1.

6. A selection matrix comprising:

(a) a plurality of semiconductor active elements each having a base electrode, a collector electrode, and a plurality of emitter electrodes;

(b) an input gate for applying a signal to the base electrode of each of said semiconductor active elements;

(c) a plurality of pulsing means each one having a first connection means for connection to one of said emitter electrodes, second connection means for connection to an enabling supply source, and a third connection means for providing an output signal; and (d) enabling means comprising means for applying a supply voltage between said second connection means and the collector electrode of the respective semiconductor active elements and further including means to change the supply voltage supplied to said second connection means in order to disable the respective pulsing means.

7. A selection matrix according to claim 6 in which said each said pulsing means is a transformer, said first and second connection means being first and second ends of a first winding and said third connection means being a connection to a second winding.

8. A selection matrix according to claim 7 in which each of said first windings is connected in series between a respective emitter electrode and a supply voltage terminal.

9. Electronic apparatus comprising:

(a) a plurality of semiconductor active elements each having a base electrode, a collector electrode, and a plurality of emitter electrodes;

(b) input gate means for applying a signal to the base electrode of each said active element independent of the base signal that it applies to the other of said elements;

(c) means to apply one side of an electrical source to the collector electrodes of said active elements;

(d) output elements arranged in at least first and second groups, (1) each output element having first and second terminals and a bilateral drive circuit connected between said terminals, (2) each output element of said first group having said first terminal thereon connected with said first terminal of an output element in said second group thereof, and (3) each output element in each group having said second terminal connected to a different emitter electrode of said same-numbered active element; and (e) switch means for selectively connecting each of said interconnected first terminals to the second side of the electrical source.

10. Electronic apparatus as defined in claim 9 in which each output element includes a transformer in which said drive circuit is a winding on said transformer.

11. A solid state circuit component in the form of a monolithic chip of single epitaxial construction and for operation with an electrical source and with a plurality of output loads, said component comprising:

(a) a semiconductor active element comprising a base electrode, a collector electrode, and a plurality of emitter electrodes;

(b) means to apply a saturating input signal to said base electrode;

(c) means to limit the saturation level of said input signal;

(d) means to connect one side of said electrical source to said collector electrode; and (e) separate output terminal means for each of said emitter electrodes each adapted for connection to one of said output loads for connection therethrough to a second side of said electrical source.

12. A solid state circuit component according to claim 11 in which said means to limit the saturation level is a transistor connected between the base and collector electrodes of said active element and shunts excess signal current from said base when the collector voltage of said element drops below the base voltage thereof sufficient to switch the conduction of said transistor.

References Cited

UNITED STATES PATENTS

| | | | |
|---|---|---|---|
| 2,913,704 | 11/1959 | Chaanghuang | 340—166 |
| 3,343,130 | 9/1967 | Petschauer et al. | 340—166 |
| 3,351,782 | 11/1967 | Narud et al. | |

OTHER REFERENCES

Scott T. Robinson, "Designing in Integrated Differential Amplifiers," Motorola Semiconductor Products Inc. Publication AN–164, pp. 1–10.

DONALD J. YUSKO, Primary Examiner

U.S. Cl. X.R.

307—303